United States Patent [19]
Lee

[11] Patent Number: 5,237,395
[45] Date of Patent: Aug. 17, 1993

[54] POWER RAIL ESD PROTECTION CIRCUIT

[75] Inventor: Kwok Fai V. Lee, Irvine, Calif.

[73] Assignee: Western Digital Corporation, Irvine, Calif.

[21] Appl. No.: 706,240

[22] Filed: May 28, 1991

[51] Int. Cl.⁵ .................................... H01L 29/78
[52] U.S. Cl. ............................ 257/358; 361/56; 361/58; 361/91; 361/111; 257/360; 257/363; 257/369
[58] Field of Search ............... 357/23.13, 42, 51; 361/56, 58, 91, 111

[56] References Cited

U.S. PATENT DOCUMENTS

| | | | |
|---|---|---|---|
| 4,990,802 | 2/1991 | Smooha | 357/23.13 |
| 5,021,853 | 6/1991 | Mistry | 357/23.13 |
| 5,051,860 | 9/1991 | Lee et al. | 357/23.13 |

FOREIGN PATENT DOCUMENTS

| | | | |
|---|---|---|---|
| 2-137269 | 5/1990 | Japan | 357/23.13 |
| 2-180068 | 7/1990 | Japan | 357/23.13 |
| WO91/05371 | 4/1991 | PCT Int'l Appl. | 357/23.13 |

OTHER PUBLICATIONS

L. Avery, "Electrostatic Discharge: Mechanisms, Protection Techniques, and Effects on Integrated Circuit Reliability", RCA Laboratories, Princeton, N.J., Jun. 1983, pp. 291-302.

C. Duvvury, et al., "Internal Chip ESD Phenomena Beyond the Protection Circuit", 1988 IEEE/IRPS, pp. 19-25.

A. Ochoa, et al., "Snap-Back: A Stable Regenerative Breakdown Mode of MOS Devices", IEEE Transactions on Nuclear Science, vol. NS-30, No. 6, Dec., 1983, pp. 4127-4130.

*Primary Examiner*—Rolf Hille
*Assistant Examiner*—Steven Loke
*Attorney, Agent, or Firm*—Spensley Horn Jubas & Lubitz

[57] ABSTRACT

An electrostatic discharge (ESD) protection circuit for protecting internal devices of an integrated circuit is coupled between the power rails of the integrated circuit. First and second current shunt paths between the power rails are maintained non-conductive during normal circuit operation and are triggered to a conductive mode in response to an ESD event on the power rails. A triggering circuit may employ a logic gate, such as an inverter with its input coupled to the positive power rail, which maintains a low level output during normal operation and provides a high output in response to an ESD event on the power rail.

20 Claims, 7 Drawing Sheets

POWER RAIL ESD PROTECTION CIRCUIT

BACKGROUND OF THE INVENTION

1. Field of the Invention

The present invention relates to solid state devices of the type employing a large number of semiconductor devices in an integrated circuit chip. More particularly, the present invention relates to circuits for protecting such semiconductor devices from damaging pulses originating on integrated circuit chip power rail pads.

2. Description of the Prior Art and Related Information

Electrostatic discharge (ESD) is an increasingly significant problem in integrated circuit design. Such potentially destructive electrostatic pulses are due to various transient sources such as human or machine handling of the integrated circuit chip during processing, assembly and installation of the chip. Such ESD events will typically originate at one or more of the integrated circuit electrical contact pads with the specific discharge path varying with the integrated circuit design and the size and polarity of the electrostatic charge applied to the pad. Increased device packing densities and diminished device geometries in modern VLSI chips have generally increased the susceptibility to damage from ESD pulses. Having effective on-chip protection against ESD is very important because elaborate and expensive environmental controls can then be avoided when the integrated circuit is being handled by human operators and assembly machines.

The majority of ESD protection circuits are directed to protection of devices coupled to the IC input/output pads. However, to provide complete protection of the chip, internal devices must also be protected against surges on the IC power pads. That is, the electrostatic pulses need to be allowed to discharge between the positive power pad and the negative power pad without causing any damage to devices interior to the IC. Furthermore, in the case of CMOS (complimentary metal oxide semiconductor) integrated circuits, because of the parasitic diodes usually associated with input/output buffers, an electrostatic pulse applied to an input/output buffer may also cause an ESD pulse between the positive and negative power rails. Moreover, lightning events and other electrical surges, that can occur when the integrated circuit chip has already been inserted into a system, can cause serious damage if the chip does not have adequate protection between the power rails.

One prior art approach to protection against internal damage is to rely merely on the internal parasitic SCR (silicon controlled rectifier) that is always present in CMOS integrated circuits. See, for example, "Electrostatic Discharge: Mechanisms, Protection Techniques, and Effects on Integrated Circuit Reliability", L. R. Avery, RCA Review, June, 1984; and "Internal Chip ESD Phenomena Beyond the Protection Circuit", C. Duvvury, et al. p. 19, 1988 IRPS Proceedings. Referring to FIGS. 1(a), 1(b) and 1(c), such a parasitic SCR present in a CMOS inverter is illustrated. More specifically, in FIG. 1(a), a schematic drawing of a CMOS inverter is shown, and, in FIG. 1(b) a cross-section through an IC incorporating the inverter is illustrated. Also, shown in FIG. 1(b) is a schematic drawing of the parasitic SCR present in the CMOS inverter structure, which schematic is also shown in FIG. 1(c) for clarity. The parasitic SCR 1 thus includes a parasitic pnp bipolar transistor 2 and a parasitic npn bipolar transistor 3, effectively coupled as illustrated in FIG. 1(c). The effective resistance of the n well region and p− epitaxial layers are illustrated schematically as resistors $r_n$ and $r_p$, respectively.

The SCR 1 will be triggered when a positive pulse is applied to $v_{DD}$ with respect to $V_{ss}$. The parasitic SCR 1 will thus latch into an on state and conduct ESD current from $V_{DD}$ to $V_{SS}$ until the ESD pulse ends. (For a negative pulse, the forward biased diode would turn on and serve as a harmless discharge path.) If the characteristics of each of these parasitic structures on the chip are similar, the ESD current will be distributed evenly, and the current density through each one will be small enough that no damage will occur. However, if any of these parasitic SCR structures is particularly more likely to conduct than the others, the current density through it may be high enough to cause damage. Indeed, in some cases melting of the silicon of the IC may occur due to the extreme current which may be drawn through a single SCR. Also, this problem is exacerbated for modern device geometries. That is, the effective resistances r and $r_p$ vary with the dimensions of the device and for modern very small devices these resistances may be high enough to cause significant heating even for less extreme current densities. Furthermore, in modern processes utilizing epitaxial materials, the parasitic SCR becomes much weaker and cannot serve as an efficient discharge path.

Another prior art approach to protection of internal devices from ESD pulses on IC power rails employs an NMOS thick oxide device coupled between $V_{DD}$ and $V_{ss}$. Such a thick oxide device 4 is shown in FIG. 2. For a large positive pulse applied to $V_{DD}$, the thick oxide device will conduct in the MOSFET mode and then, shortly afterwards, conduct in a bipolar mode. While this type of device may provide good protection if designed properly, for certain fabrication processes the necessary design constraints for good protection will be incompatible with normal operation of the remainder of the IC. For example, the thick oxide device's threshold voltage may need to be made very high to ensure that the thick oxide device 4 will not turn on during normal IC operation. In such cases, the thick oxide device 4 will not be able to turn on until it enters avalanche breakdown, which turn on mode may not occur quickly enough during an ESD event to prevent damage. In such case a parasitic SCR may turn on first drawing extremely high current as noted above and possibly destroying the IC before the thick oxide device turns on.

Accordingly, a need presently exists for an improved integrated circuit design which provides increased resistance to internal chip damage due to ESD pulses applied to the power rail of the chip.

SUMMARY OF THE INVENTION

The present invention provides an electrostatic discharge (ESD) protection circuit for coupling to integrated circuit power rails, which specifically protects such integrated circuits against internal damage and which is extremely effective over a wide range of ESD pulse voltages.

In a preferred embodiment, the present invention provides an ESD protection circuit for an integrated circuit (IC) which employs three circuit stages to provide ESD protection against internal chip damage due to ESD pulses applied to the integrated circuit power rails. The first stage employs a lateral bipolar device coupled between the IC power rail and IC ground, which device is capable of conducting in a low resistance mode. For example, an n channel thick oxide field effect device with its gate tied to IC ground so as to conduct only in a bipolar mode, may be employed. The second stage employs a thin oxide field effect transistor (FET) that is coupled between the power rail and IC ground. This FET is turned off during normal IC operation. When turned on, this FET provides a shunt path for ESD current. Also, the FET is capable of injecting carriers into the substrate from impact ionization, when there is a significant gate voltage, to aid in turn on of the first stage. The second stage also includes a device to protect the FET from damage due to high current levels, for example, a distributed resistor may preferably be employed. The third stage employs a logic gate that biases the gate of the FET in the second stage to zero during normal operation, but is able to provide a significant gate bias if the power supply is ramped up rapidly. This thus triggers the second stage into a conductive mode in response to an ESD event on the power rails. In a preferred embodiment, the logic gate may be an inverter with its input coupled to the IC power rail and its output coupled to the FET gate. In response to a power surge on the power rail, capacitive coupling to the inverter output sends the output high, turning on the FET.

Accordingly, the present invention provides an ESD protection circuit that can be readily attached to the power rails of an integrated circuit chip, is readily compatible with modern CMOS process technology, and provides good ESD protection without introducing any restriction on the layout of the internal circuits.

Further features and advantages of the present invention will be appreciated from the following detailed description of the invention.

DETAILED DESCRIPTION OF THE INVENTION

Figure 1B:
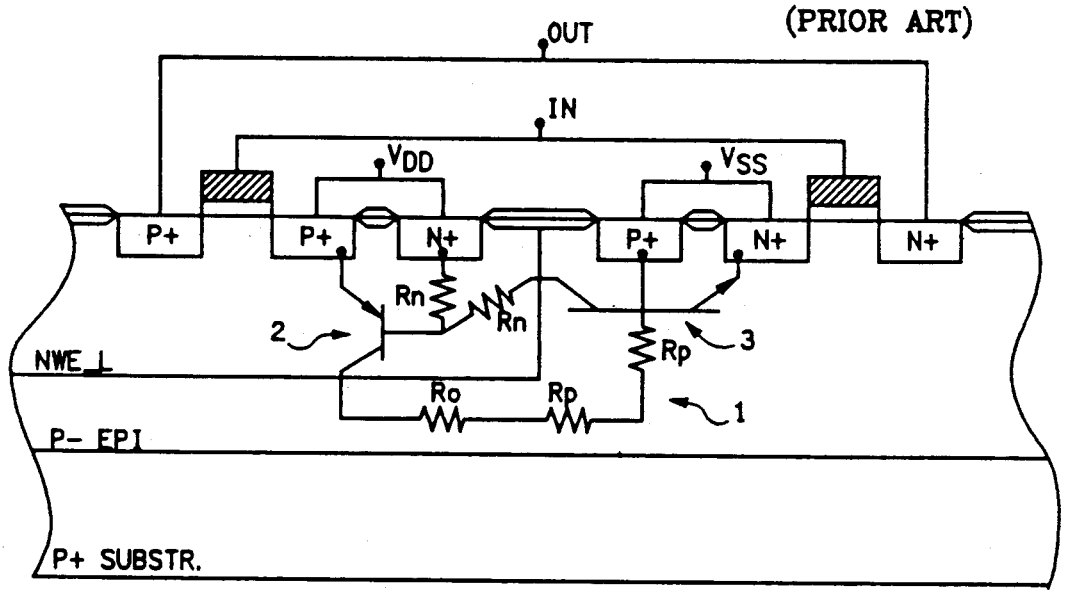
FIG. 1(a) and 1(b) are schematic and cross-sectional drawings, respectively, of a conventional CMOS inverter, the latter illustrating a parasitic SCR structure.
Figure 1A:
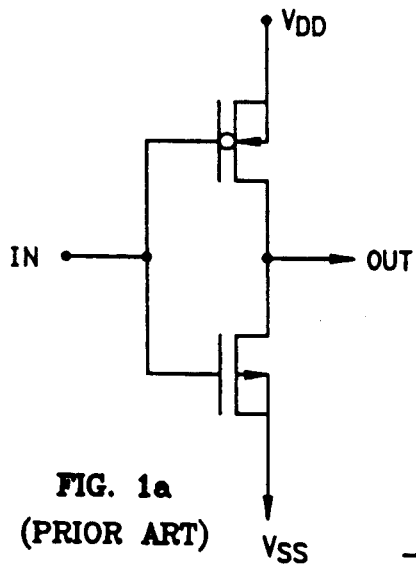
Figure 1C:
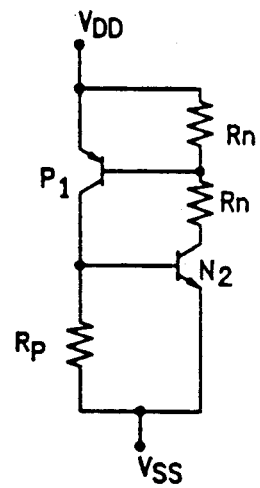
FIG. 1(c) is a schematic drawing of the parasitic SCR of FIG. 1(b).
Figure 2:
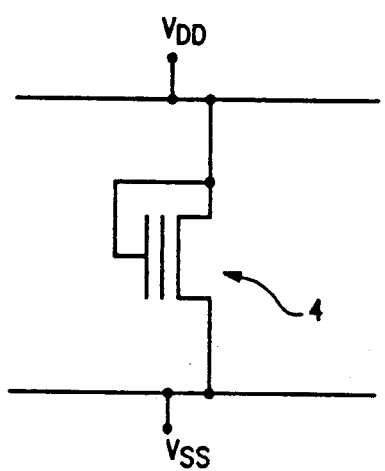
FIG. 2 is a schematic drawing of a prior art ESD protection circuit employing a thick oxide device between $V_{DD}$ and $V_{SS}$.
Figure 3:
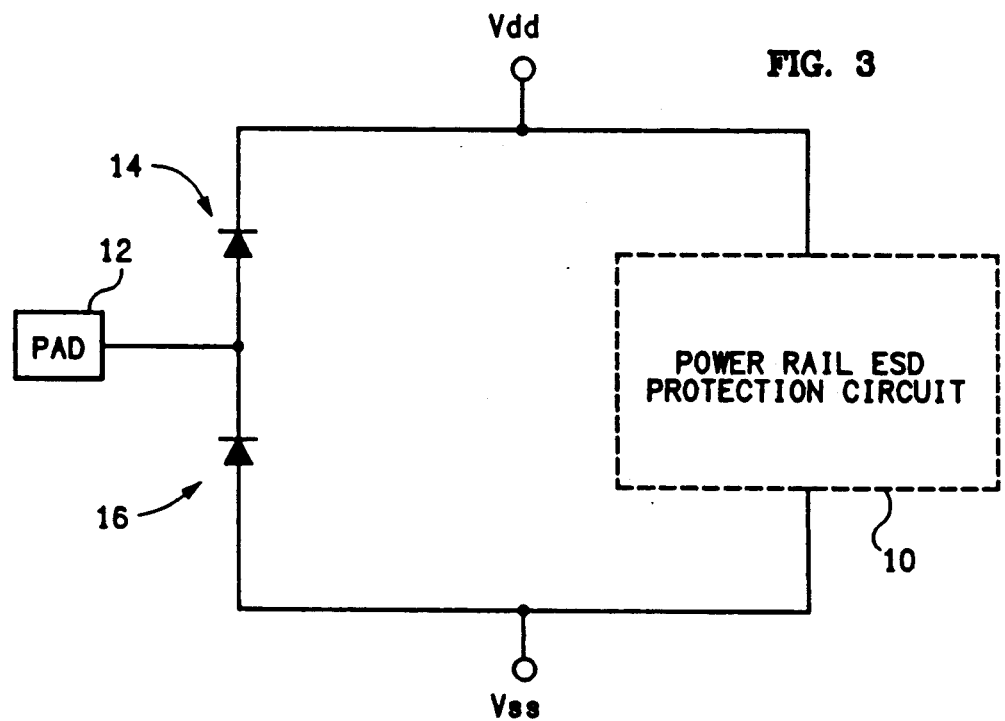
FIG. 3 is a schematic drawing of a preferred embodiment of the ESD protection circuit of the present invention.

Referring to FIG. 3, the electrostatic discharge (ESD) protection circuit 10 of the present invention is illustrated. In a preferred embodiment, the ESD protection circuit 10 is integrated with a VLSI integrated circuit (IC) chip and is coupled between the IC positive power supply ($V_{DD}$) and IC ground ($V_{SS}$) as shown in FIG. 3. The integrated circuit chip will typically have a number of electrical contact pads for both input and output electrical connections with external devices. For convenience, however, only a single pad 12 is illustrated in FIG. 3. Although FIG. 3 illustrates the ESD protection circuit 10 in conjunction with the pad 12, circuit 10 may be placed anywhere in the IC between the two power rails $V_{DD}$ and $V_{SS}$, and need not be adjacent an input/output pad. Accordingly, the present invention provides little or no constraint in IC layout as it may be configured wherever extra chip area is available.

When attached between the power rails, ESD protection circuit 10 will be able to provide an efficient discharge of ESD voltage pulses that appear between $V_{DD}$ and $V_{SS}$ without causing any internal damage to the IC. This ESD pulse may appear directly between the $V_{DD}$ and $V_{SS}$ voltage supplies due to direct application of the pulse to a power rail pad. Alternatively, a large transient voltage may also appear between $V_{DD}$ and $V_{SS}$ when a positive pulse is applied to an input or output pad 12 with $V_{SS}$ as the reference node, or when a negative pulse is applied to an input or output pad with $V_{DD}$ as the reference node. This is illustrated in FIG. 3 by the coupling of the $V_{DD}$ and $V_{SS}$ rails to input/output pad 12 via diodes 14 and 16. These diodes 14 and 16 are inherently present in most CMOS devices, and provide an effective coupling between input/output pad 12 and $V_{DD}$ and $V_{SS}$. More specifically, when a large positive pulse is applied to input or output pin 12, the parasitic diode 14 to $V_{DD}$ turns on in the forward bias mode and rapidly charges $V_{DD}$ to a high voltage. Alternatively, when a negative pulse is applied to input or output pin 12, the parasitic diode 16 to $V_{SS}$ reaches a high negative voltage with respect to $V_{DD}$ and biases the $V_{SS}$ rail to high negative voltage. The ESD protection circuit 10 of the present invention is also able to provide an efficient discharge of these ESD pulses.

Figure 4:
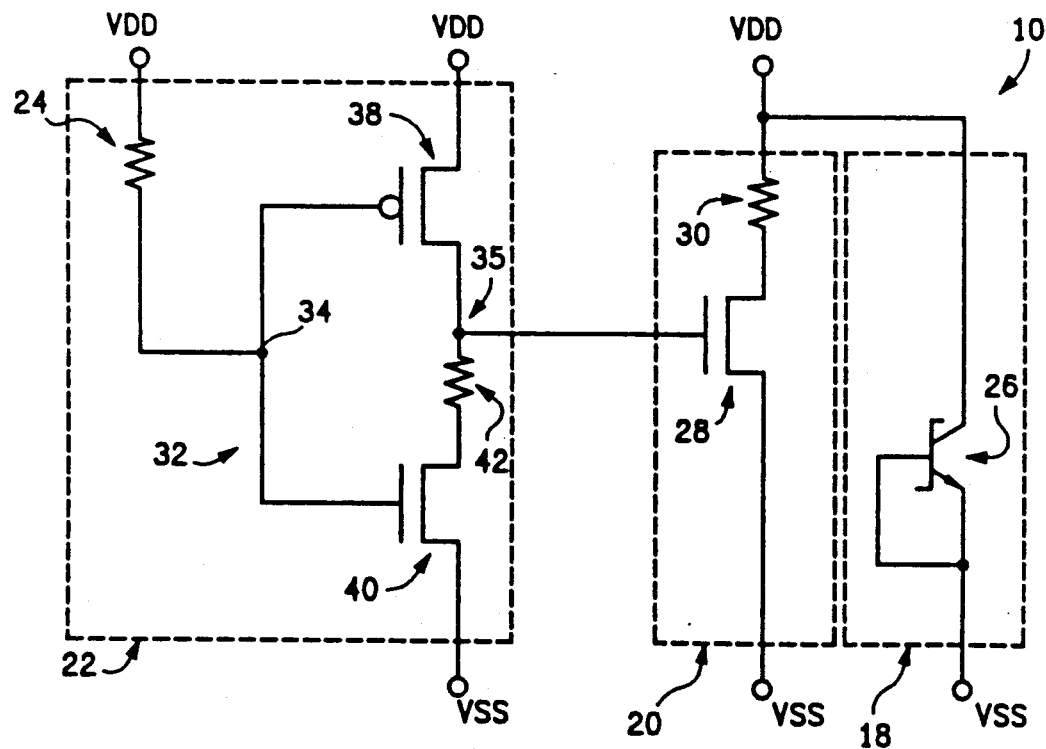
FIG. 4 is a schematic drawing illustrating the Esd protection circuit of the present invention configured near an IC power pad.

Referring to FIG. 4, a schematic diagram of the ESD protection circuit 10 is illustrated in a preferred embodiment. As shown, the circuit 10 employs two stages 18, 20, respectively providing first and second ESD current shunt paths between $V_{DD}$ and $V_{SS}$. The circuit 10 further employs a third stage 22 which serves as a trigger to turn on the first and second current shunt paths in response to an ESD pulse between $V_{DD}$ and $V_{SS}$, while maintaining them in a nonconductive state during normal circuit operation.

As illustrated in FIG. 4, the first stage of ESD protection circuitry 18 preferably employs an ESD shunt device 26 to provide a first shunt path from $V_{DD}$ to $V_{SS}$ for the ESD current. In a preferred embodiment, current shunt device 26 is fabricated as a thick oxide "snapback" device. The characteristics of the snap-back device are such that for sufficiently high voltage pulses applied to the $V_{DD}$ rail, the snap-back device 26 will turn on quite rapidly and provide a low resistance path for the ESD current which will shunt substantially all the ESD pulse to $V_{SS}$ and prevent damage to any internal IC devices. The snap-back device 26 preferably employs an n channel field effect transistor structure with a thick oxide region formed over the channel and the gate tied to the source and $V_{SS}$, as illustrated in FIG. 4. Since the gate of the snap-back device 26 is tied to $V_{SS}$, the device is held off in a field effect conduction sense. The device 26 is turned on by avalanche breakdown across the drain/channel junction due to a large ESD pulse on $V_{DD}$ (rather than by channel turn-on). The current/voltage characteristics of the device 26 after turn on give rise to the name "snap-back" due to the tendency of the current vs. voltage curve to "snap-back" to a very low resistance after full turn on of the device. Such a snap-back effect provides low resistance shunting of ESD pulses and hence provides reduced heating during shunting ESD pulses. This snap-back effect will be discussed in more detail below in relation to FIG. 5.

Still referring to FIG. 4, the second stage 20 of ESD protection circuit 10 preferably employs an n channel MOSFET 28 and a resistor 30 forming a second current shunt path between the $V_{DD}$ and $V_{SS}$ rails of the IC. As illustrated in FIG. 4, the gate of MOSFET 28 is coupled to the third stage 22 of circuit 10. The gate of n channel MOSFET 28 is held low by third stage 22 during normal circuit operation so that the second ESD current shunt path is off. During an ESD event on the power rails, however, third stage 22 biases the gate of MOSFET 28 high so as to turn on the second ESD current shunt path. The resistor 30 is provided to protect MOSFET 28 due to damage from high currents from an ESD pulse, since only the second current path will typically be active during the very initial portion of an ESD pulse. Resistance to damage during this initial phase of the ESD pulse may be further increased by integrating the resistor 30 with the MOSFET 28 so as to provide an extended current path. If breakdown of the MOSFET 28 occurs, this extended structure will tend to crowd current toward the breakdown point, increasing the effective resistance greatly, and thereby protecting the MOSFET 28 from further damage until the first stage 18 turns on. This integrated resistor/MOSFET structure will be described in more detail below in relation to FIGS. 6-8.

As further illustrated in FIG. 4, the third stage 22 of ESD protection circuit 10 preferably employs a CMOS inverter 32 with its input node 34 coupled to $V_{DD}$ through resistor 24 and its output node 35 coupled to the gate of MOSFET 28. The inverter 32 includes a p channel MOSFET 38, an n channel MOSFET 40, and a resistor 42, coupled between $V_{DD}$ and $V_{SS}$ as illustrated in FIG. 4. Since the input node 34 of inverter 32 is tied to $V_{DD}$, i.e., is held high, the output at output node 35 will normally be held low, maintaining MOSFET 28 in an off condition. Although third stage 22 shown in FIG. 4, is preferably a CMOS inverter with the input node tied to $V_{DD}$, alternatively, any type of logic gate that would normally give a low voltage at the output with a stable power supply, may be employed.

In an ESD surge, whether originating on the power rails or from an input/output pad through diode breakdown, the voltage between $V_{DD}$ and $V_{SS}$ quickly builds up. The first part of the circuit 10 to respond to the surge is the third stage 22. Inverter 32 is designed so that the output at node 35 will be capacitively coupled and pulled up to a fairly high voltage when the voltage at $V_{DD}$ is ramped up rapidly in response to an ESD pulse on the IC power rail $V_{DD}$. In particular, resistor 24 is chosen to be fairly large so that the gate of n channel MOSFET 40 will remain low during the rapid transient pulse keeping MOSFET 40 from turning strongly on. Furthermore, MOSFET 40 is chosen to have a narrow channel width and a long channel length to ensure weak pull-down strength. Resistor 42 is added to further weaken the pull-down strength of resistor 40, as well as to provide protection to MOSFET 40. P channel MOSFET 38 in turn is designed with a wide channel width and a short channel length to improve its pull-up strength and also the increase the coupling capacitance between $V_{DD}$, coupled to the source of MOSFET 38, and the output node 35, coupled to the drain of MOSFET 38. As a result, when the positive voltage rail $V_{DD}$ ramps up rapidly, the output node 35 also rises (although not to the same voltage as the $V_{DD}$ voltage, to a significant fraction of it) and MOSFET 28 is turned on.

Figure 5:
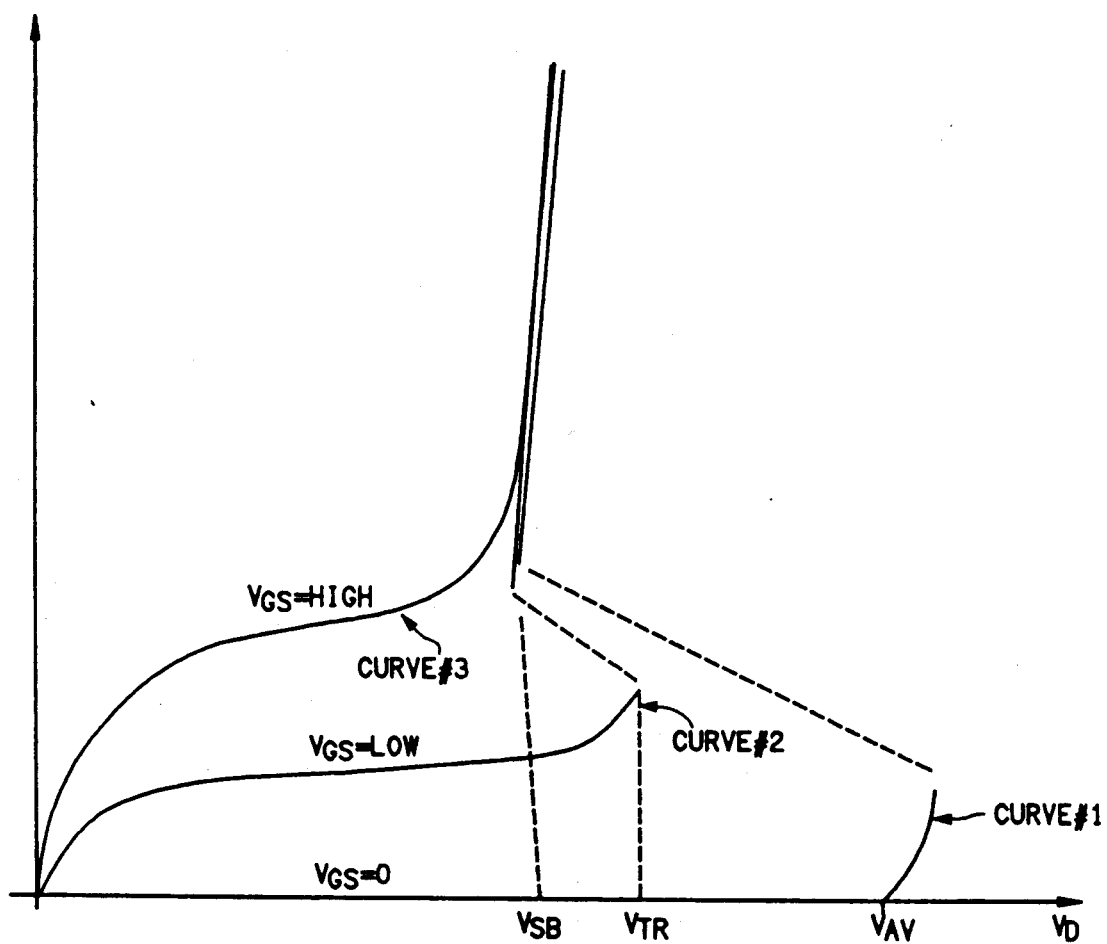
FIG. 5 is a graph of current vs. voltage for the snapback device employed in a preferred embodiment of the present invention.

Before the response of the second stage 20 is considered in detail, the breakdown characteristics of an enhancement type n channel MOSFET may be reviewed for clarity of discussion. In FIG. 5, curve number 1 shows the breakdown characteristics of the n channel MOSFET device if the gate voltage is held the same as the source voltage. As may be seen, there is no significant current until the avalanche breakdown voltage ($V_{AV}$) is reached and current starts to flow from the drain to the substrate. At that point, the current rises sharply with respect to the increase in drain voltage, until at some point, the substrate current generated from the breakdown induces the lateral npn transistor to turn on. The n channel MOSFET is then said to "snap-back" through a negative resistance regime to a second snap-back voltage VSB, substantially lower than $V_{AV}$. In this snap-back mode, the NMOSFET is conducting primarily as an npn bipolar transistor, with the base current being the substrate current being generated from impact ionization. Referring to curve number 2, when the gate to source voltage $V_{GS}$ is higher than the threshold voltage of the n channel MOSFET, the operation of the MOSFET in the saturation region creates a high electric field near the drain even when the drain voltage is lower than $V_{AV}$. As a result, the n channel MOSFET creates substantial current from impact ionization at a much lower voltage than $V_{AV}$. The substrate current increases, until at some voltage $V_{TR}$ it is triggered to snap-back. If the gate voltage is increased still further, as shown in curve number 3, the breakdown would transition smoothly from a MOSFET mode of conduction to a bipolar mode conduction, and no actual "snap-back" characteristic can be seen.

In view of the foregoing, it will be appreciated that as the gate of n channel MOSFET 28 is coupled to a fairly high voltage by the action of third stage 22 described above, MOSFET 28 will conduct in the MOSFET mode initially. Then, shortly after being turned on, MOSFET 28 will start to generate substantial impact ionization substrate current. This substrate current builds up a substantial potential on the part of the substrate near the surface. The snap-back device 26 is preferably configured in close proximity to the MOSFET 28, so that when the bipolar action of MOSFET 28 is triggered to turn on, the snap-back device 26 also starts to turn on. Once the snap-back device 26 begins to conduct in the bipolar mode, it shunts most of the current through the first current path because of the presence of resistor 30 in series with MOSFET 28. Resistor 30 is chosen to provide a resistance that is sufficient to protect the n channel MOSFET 28 against damage yet is small enough so that the voltage at the drain of MOSFET 28 will still be close to $V_{DD}$. One type of resistor which is suitable for this purpose is an extended resistive structure integrally formed with MOSFET 28, in a manner illustrated in FIGS. 6 and 7, discussed below.

Although the circuit illustrated in FIG. 4 is preferred for most CMOS applications, various modifications can be made for certain processes and applications. For example, for certain fabrication processes with n channel MOSFETs that can dissipate large currents without suffering damage, (for example, if the gate oxide is sufficiently thick) resistor 30 and snap-back device 26 can be eliminated while remaining within the scope of the present invention.

Figure 6:
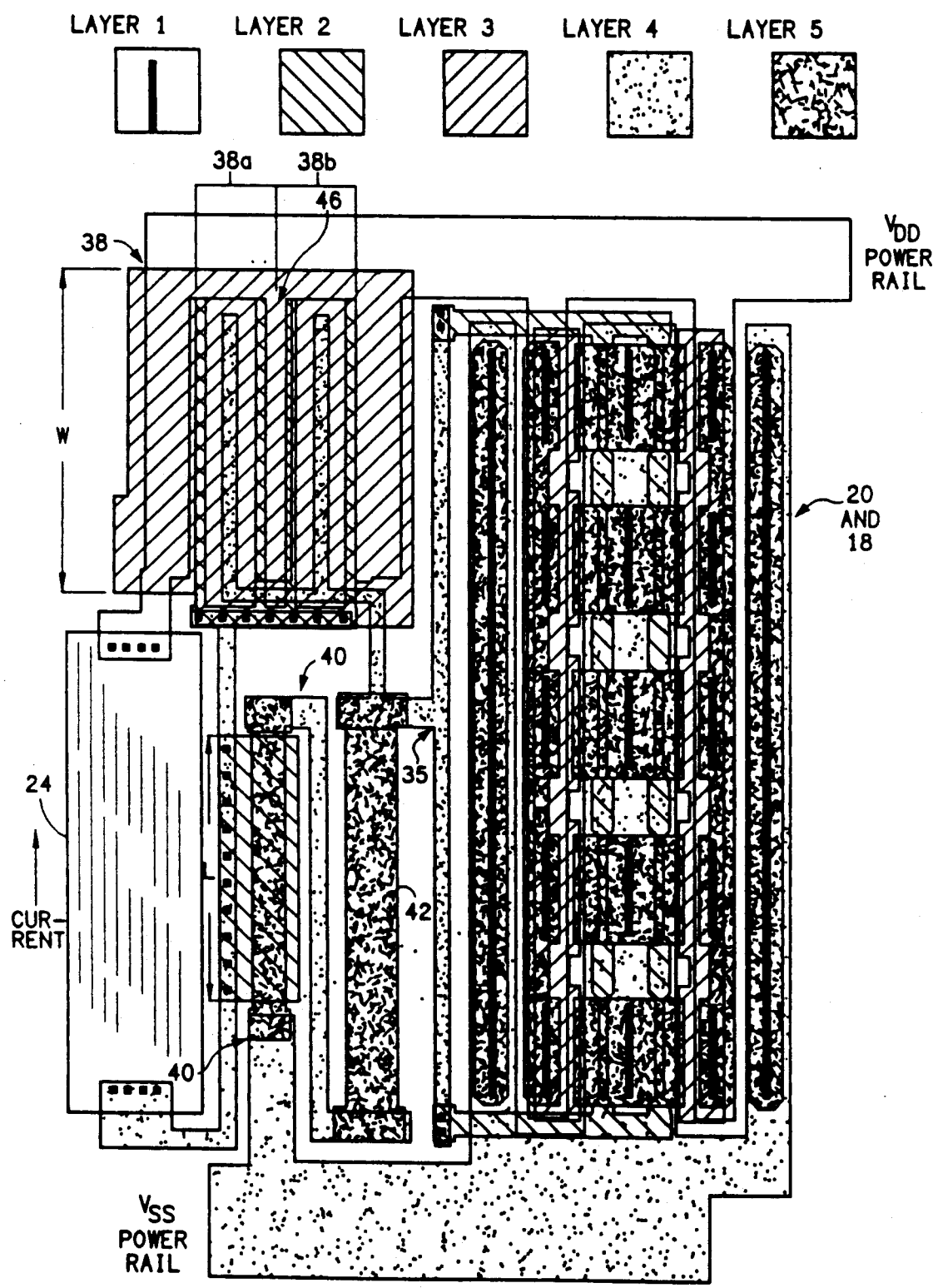
FIG. 6 is a top view of the layout of a CMOS implementation of the ESD protection circuit of the present invention, implemented in an IC substrate.

Referring to FIG. 6, a top view of a preferred implementation of the circuit of FIG. 4 in an IC is illustrated. As may be seen, the first and second stages 18 and 20 of circuit 10 are coupled to the $V_{DD}$ and $V_{SS}$ power rails and are integrated together in a very compact configuration. As will be discussed in more detail in relation to FIGS. 7, 8(a) and 8(b), this layout provides a number of advantages in addition to taking up a minimal amount of chip area.

As may be appreciated from FIG. 6, in a preferred embodiment, the layout of MOSFETs 28 and 38 are provided in a "folded" configuration which provides a more effective use of the chip area. For example, MOSFET 38 is laid out with a first MOSFET 38a and a second "mirror image" MOSFET 38b having a shared drain diffusion 46. This provides an effective width of MOSFET 38 which is double the width W taken up on the chip. (Current flow is in the length direction L. This configuration is particularly advantageous since the wide but short configuration provides the relatively high current carrying capability desired for triggering MOSFET 28 in response to an ESD pulse as discussed above.

As may be seen from FIG. 6, p channel MOSFET 38 is very wide and short (in the direction of current flow) whereas n channel MOSFET 40 is quite long and narrow. For example, MOSFET 38 may be approximately 100 μm wide and 1.75 μm long while MOSFET 40 is approximately 6 μm wide and 50 μm long. This provides the desired weak pull down effect for MOSFET 40 coupled to $V_{SS}$ and the stronger effect of MOSFET 38 coupled to $V_{DD}$ to provide a high voltage at inverter output node 35 in response to an ESD event on $V_{DD}$. Also, resistor 24 is designed to provide a large resistance, e.g., about 3KΩ. For example, a large phosphorous diffusion resistor may be employed as illustrated in FIG. 6. Resistor 42, in turn is chosen smaller, e.g., about 175Ω. A higher concentration of phosphorous or an arsenic diffusion may preferably be employed for resistor 42. These values of resistance and dimensions may provide a suitable rise in voltage at node 35 to turn on MOSFET 28. However, it will be appreciated that other suitable combinations of values and layouts may be chosen which are equally suitable.

Figure 7:
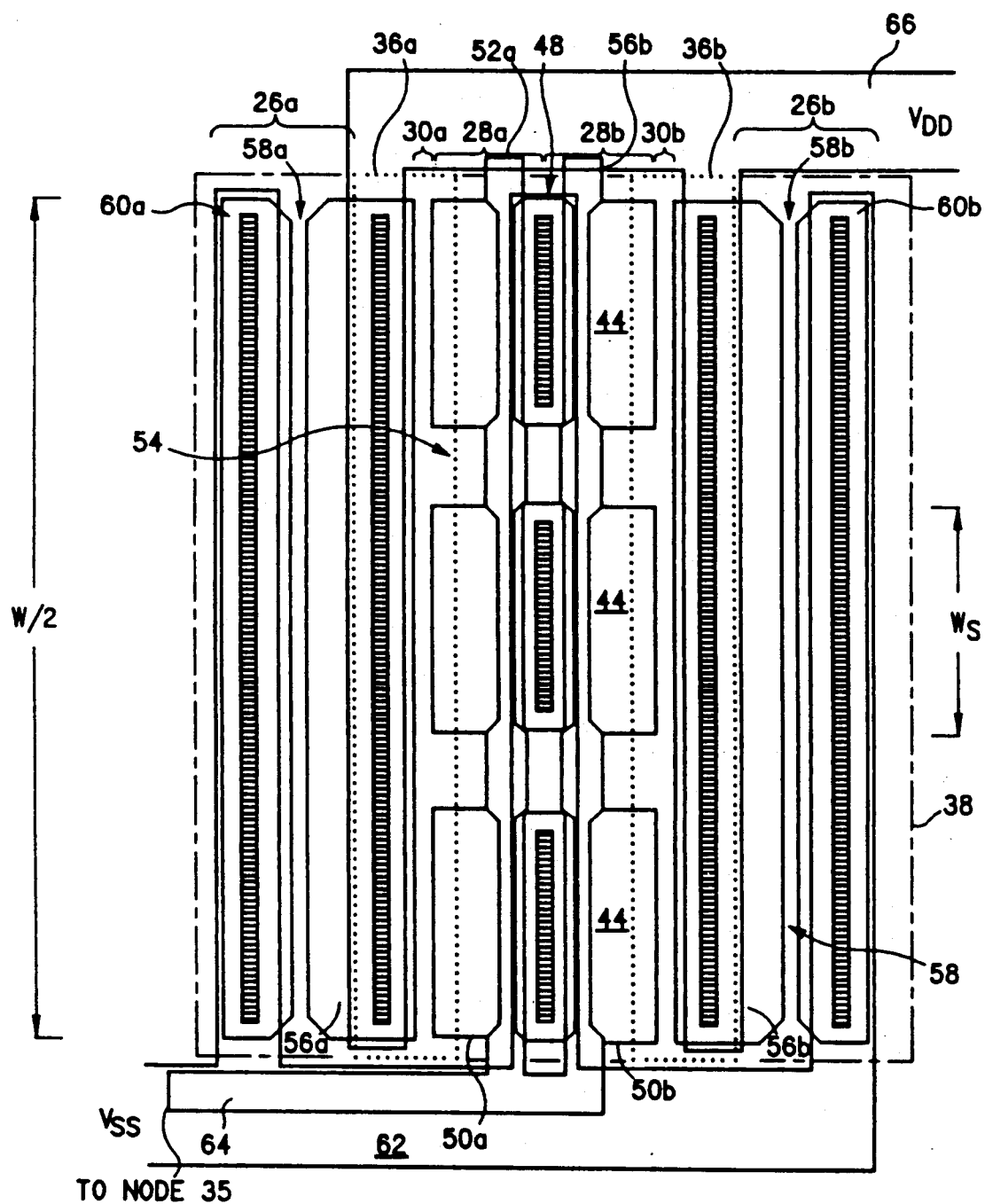
FIG. 7 is a top view of the CMOS IC implementation of the second and third stages of the ESD protection circuit of the present invention.
Figure 8A:
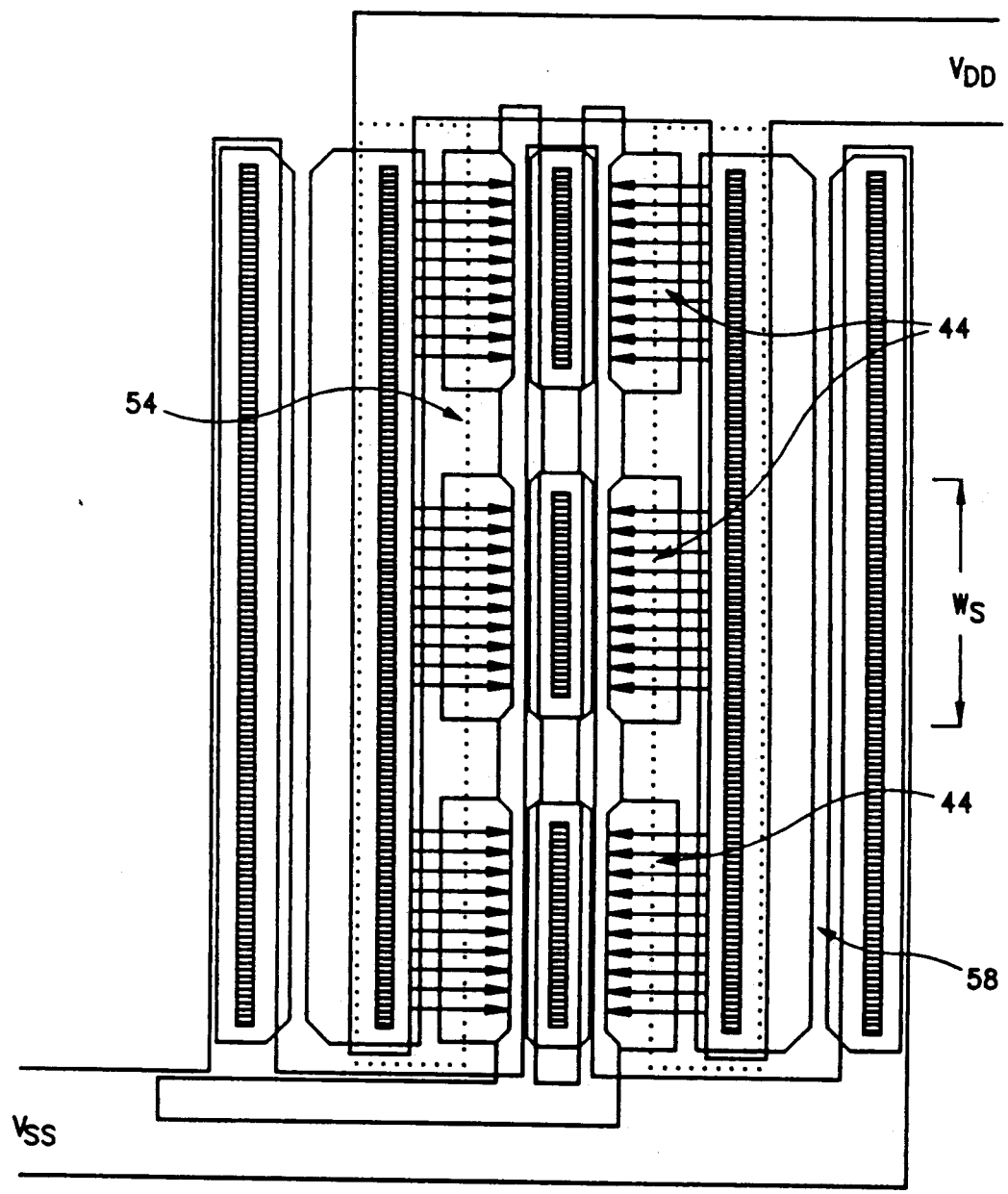
FIGS. 8(a) and 8(b) are two views of the implementation of FIG. 7 showing the current path during normal conduction and breakdown conduction, respectively.
Figure 8B:
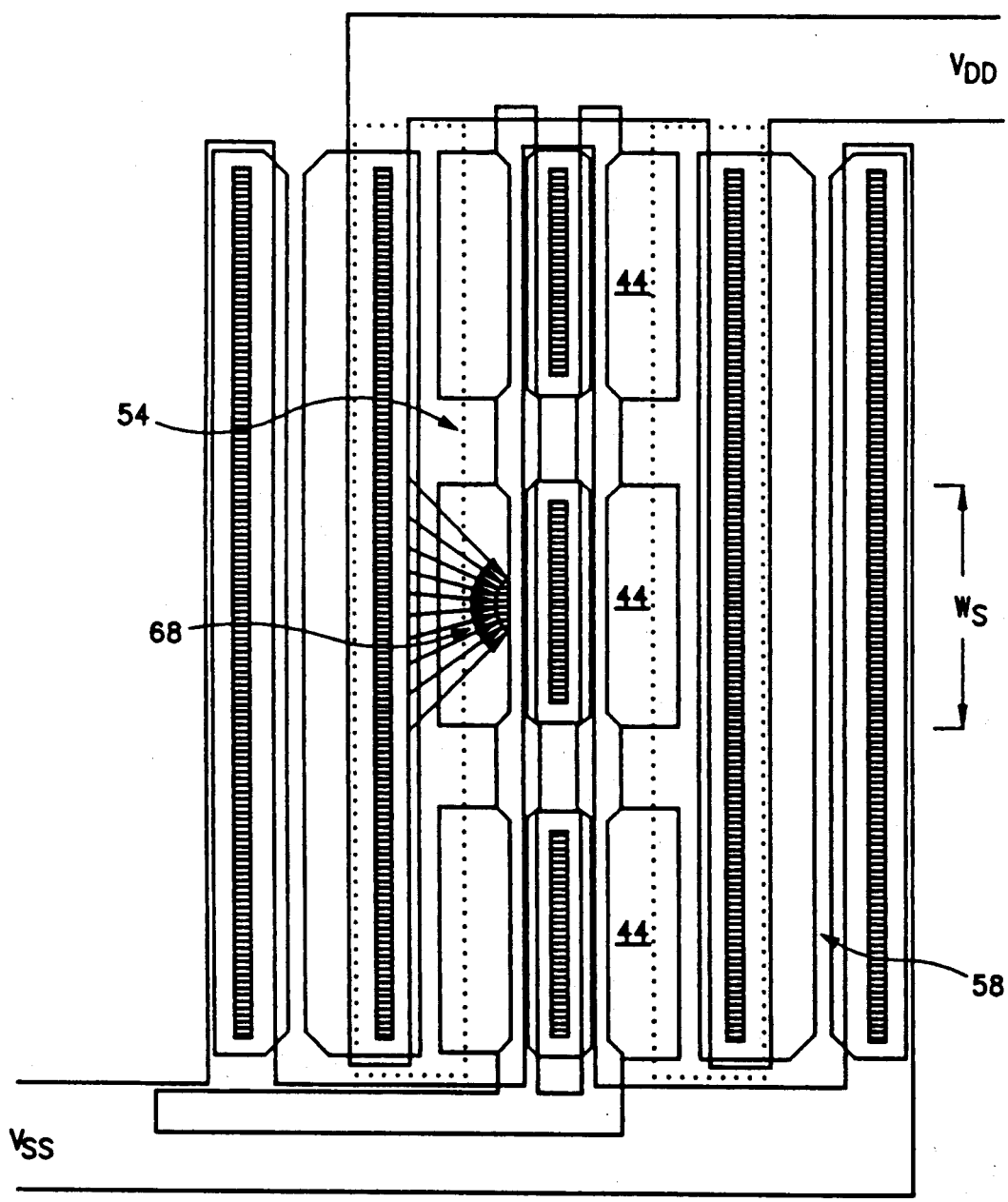

Referring to FIGS. 7, 8(a) and 8(b), the integrated second and third stages 18 and 20 are illustrated in more detail. As illustrated in FIG. 7, n FET 28 is preferably composed of a number of discrete FET segments 44. (For convenience of illustration, only six FET segments 44 for MOSFET 28 are illustrated, whereas 10 are shown in FIG. 6.) The discrete FET segments 44 will preferably have separate drain and source diffusions and separate gate structures which are electrically coupled together in a parallel configuration such that they function together as a single FET 28. This segmented FET structure provides several significant advantages.

The resistive structure 30 illustrated in FIG. 4 may preferably be implemented as an extended structure 36 extending adjacent all the individual FET segments 44. For example, in a preferred embodiment, extended resistive structure 36 may be an elongated n well diffusion extending adjacent the FET segments 44. The extended resistive structure thus provides a resistive path extending the full width of the n channel MOSFET 28. The extended nature of this two-dimensional resistive path gives rise to a bimodal resistance characteristic discussed below in relation to FIGS. 8(a) and 8(b).

As may be clearly seen in FIG. 7, the FET segments 44 have separate source diffusions 48, drain diffusions 50 and gate structures 52 with spaces 54 between segments. As also illustrated, the discrete FET segments have common contact metallizations 62, 64, 66 for the source gate and drain contacts, respectively, to provide the parallel electrical connection. As further illustrated in FIG. 6, n wells 36a, 36b are provided as elongated "finger shaped" diffusions which extend adjacent the drain diffusions 50 of each FET segment 44. Part of each drain diffusion 50 extends into the n well 36. Additionally, drain contact regions 56a, 56b are provided as elongated "finger shaped" n+diffusions extending adjacent the extended n well 36a, 36b and partially overlapping with n well diffusions 36a, 36b. The drain contact metallization 66 has a matching elongated shape to provide the parallel drain contact to each of FET segments.

Although the snap-back device 26 is illustrated in FIG. 4 as spaced apart from FET 28, ESD protection may be increased by closing the proximity of the snap-back device and the MOSFET 28. For example, the proximity may be closed to such an extent that the collector terminal of the snap-back device is actually the same diffusion as the drain of the MOSFET 28, i.e., the snap-back device is "integrated" with the n MOSFET output buffer.

As illustrated in FIG. 6, snap-back device 26 is so integrated with the FET segments 44 and has a matching elongated structure. More specifically, snap-back device 26a, 26b employs elongated n+diffusions 56a, b as its drain. The snap-back channel region 58a, b and elongated collector/source diffusion 58, 60 are similarly provided in an elongated "finger shaped" configuration to provide a wide current carrying path for snap-back device 26a, b without requiring significant extra chip area. Alternately, the snap-back device 26 may be positioned away from the segmented buffer FETs 44 rather than integrated therewith; for example, where chip layout considerations mitigate against a side by side arrangement.

Referring to FIGS. 8(a) and 8(b), current flow through segmented MOSFET 28 is illustrated during normal operation of the circuit during an ESD event and when breakdown of the MOSFET occurs, for example, in response to a very high voltage ESD event or a delayed turn on of first stage 18.

As shown in FIG. 8(a), during normal conduction the current flow in the device will be relatively uniform across each segment width $w_S$ in a direction indicated by the arrows. That is, current will flow in parallel through the FET segments 44 from the drain contact n+region 56a, b through the extended resistive path formed by n well 36a, b to the n+drain diffusion 50a, b.

The current in turn will then flow through the channel region of each segment of MOSFET 2 to source diffusion 48 as in normal flow operation. For a sheet resistance for n well region 36a, b of approximately 625 ohms/square and a device width W of approximately 200 microns, this results in an effective resistance for the resistor 30 as low as 9 ohms. This provides a relatively negligible load and as a result relatively high shunt currents may be drawn through the second current path to $V_{SS}$.

Referring to FIG. 8(b), current flowing during breakdown of the MOSFET 28 is illustrated. The segmented MOSFET 28 will typically undergo a breakdown at a specific point 68 along the perimeter of the gate oxide channel region. Since the rest of the device is turned off, the current will be force to flow in a funnel-shaped path through the breakdown point 68. This "current crowding" is illustrated by the arrows in FIG. 8(b). This current crowding will result in an extremely high effective resistance during breakdown. For example, the effective resistance during such a breakdown may rise to approximately 90 ohms.

Accordingly, it will be appreciated that the combination of the segmented buffer FET and extended n well resistor provides an increase of 1000% in effective resistance for breakdown over normal device operation. This extremely high effective resistance thus provides a very effective protection for the n channel MOSFET 28 from serious damage during the ESD pulse. Additionally, the high resistance will tend to increase the potential applied to snap-back device 26 causing it to turn-on and shunt the ESD current through first stag 18, even when the FET breaks down first.

Although the width W of the buffer FET will vary with the specific integrated circuit design and application, the individual FET segments preferably will have a width $w_S$ of 21 μ or less. The optimum width of FET segments has been determined by placing an ESD charge at I/O pins having different width segments coupled thereto, and determining the failure rate. Tests determined that FET segments with widths of 21μ or less provide optimum protection during ESD events.

It will be appreciated by those of ordinary skill in the art that a wide variety of modifications may be made in the above-described embodiment whole remaining within the scope of the present invention. For example, while the preferred embodiment of the invention has been described in terms of an implementation in a CMOS integrated circuit, employing twin tub process technology, it will be appreciated that a wide variety of other types of integrated circuit process technologies may advantageously employ the present invention. Also, while the preferred embodiment of the ESD protection circuit 10 has been described above as coupled between IC positive and ground power rails, it may also be advantageously incorporated with input/output buffer circuitry and/or coupled to input/output pads. That is, by replacing the $V_{DD}$ connections shown in FIG. 4, with connections to an input pad (or output pad) protection against damage to input (or output) circuitry due to ESD pulses on the pad may be prevented. A wide variety of additional modifications are also possible to the preferred embodiment of the present invention as described above, while remaining within the scope of the present invention.

What is claimed is:

1. A circuit for protecting internal devices, in an integrated circuit having a first line and a second line coupled to respective integrated circuit pads, from electrostatic discharge (ESD) events, comprising:
   discharge means, coupled between said first line and said second line for providing a first current path for discharging ESD current from said first to said second lines;
   triggering means coupled to the discharge means, for maintaining said discharge means in a nonconductive mode during normal operation of the integrated circuit and for triggering said discharge means to enter a conductive mode upon occurrence of an ESD event on one of said first and second lines.

2. A circuit for protecting internal devices in an integrated circuit as set out in claim 1, further comprising a thick oxide field effect transistor coupled between the first and second lines so as to form a second current path.

3. A circuit for protecting internal devices in an integrated circuit as set out in claim wherein said discharge means comprises an n channel field effect transistor coupled between the first and second lines and having the gate thereof coupled to the triggering means.

4. A circuit for protecting internal devices in an integrated circuit as set out in claim 3, wherein said discharge means further comprises a resistor coupled between said first line and said n channel field effect transistor.

5. A circuit for protecting internal devices in an integrated circuit as set out in claim 4, wherein said resistor is an extended resistive structure integrally formed with the n channel field effect transistor.

6. A circuit for protecting internal devices in an integrated circuit as set out in claim 5, wherein said n channel field effect transistor comprises a plurality of separate transistor segments coupled to conduct in parallel as a single transistor.

7. A circuit for protecting internal devices in an integrated circuit as set out in claim 6, wherein said extended resistive structure is an elongated n well formed adjacent the drain regions of the transistor segments of said n channel field effect transistor.

8. A circuit for protecting internal devices in an integrated circuit as set out in claim wherein said triggering means comprises a gate coupled to said lines and providing a first voltage output when normal voltages are provided by said lines and providing a second trigger voltage when one of said lines transitions to a voltage corresponding to an ESD event.

9. A circuit for protecting internal devices in an integrated circuit as set out in claim 8, wherein said gate is an inverter having the input thereof coupled to the first line and the output thereof coupled to said discharge means.

10. A circuit for protecting internal devices in an integrated circuit as set out in claim 9, wherein said first line is the integrated circuit positive power supply and the second line is integrated circuit ground.

11. A circuit for protecting a CMOS integrated circuit, having a positive power rail and a ground rail, from electrostatic discharge (ESD) events, comprising:
   a first n channel field effect transistor, having a gate, a source and a drain, coupled between said positive power rail and said ground rail so as to provide an ESD current shunt path between said power rail and ground rail when said field effect transistor is in a conductive mode;

a first resistor coupled in series between said positive power rail and the drain of said first n channel field effect transistor; and a CMOS inverter having its input coupled to said positive power rail and its output coupled to the gate of said first n channel field effect transistor.

12. A circuit as set out in claim 11, further comprising a second resistor coupled between said positive power rail and the input of said CMOS inverter.

13. A circuit as set out in claim 12, wherein CMOS inverter comprises a p channel field effect transistor and a second n channel field effect transistor coupled between said positive power rail and said ground rail and a third resistor coupled between the drain of the second n channel transistor and the output of the inverter.

14. A circuit as set out in claim 13, wherein said p channel transistor has a width dimension perpendicular to the direction of current flow therethrough which is substantially greater than the length dimension parallel to the direction of current flow.

15. A circuit as set out in claim 14 wherein said width dimension of said p channel transistor is approximately 100 μm and said length dimension is approximately 1.75 μm.

16. A circuit as set out in claim 14, wherein said second n channel transistor comprising said CMOS inverter has a length dimension in a direction parallel to the direction of current flow substantially larger than the width dimension perpendicular to the direction of current flow.

17. A circuit as set out in claim 16, wherein said length dimension of said second n channel field effect transistor is approximately 50 μm and said width dimension is approximately 6 μm.

18. A circuit as set out in claim 11, further comprising a thick oxide n channel field effect transistor coupled between the positive power rail and ground rail and having its gate ties to the source and the ground potential so as t be only conductive in a parasitic bipolar mode.

19. A circuit as set out in claim 11, wherein said first resistor has a first relatively low resistance during normal conduction operation of said first n channel field effect transistor and a second substantially higher resistance during breakdown of a portion of the first n channel field effect transistor.

20. A circuit as set out in claim 19, wherein said first resistor is an elongated n well structure extending adjacent the drain of said first n channel field effect transistor.

* * * * *